(12) United States Patent
Nedovic (10) Patent No.: US 8,258,885 B2
(45) Date of Patent: Sep. 4, 2012

(54) FREQUENCY-COUPLED LCVCO

(75) Inventor: Nikola Nedovic, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 88 days.

(21) Appl. No.: 12/853,104

(22) Filed: Aug. 9, 2010

(65) Prior Publication Data

US 2012/0032745 A1   Feb. 9, 2012

(51) Int. Cl.
*H03B 5/12* (2006.01)
(52) U.S. Cl. .................... 331/117 FE; 331/46; 331/55
(58) Field of Classification Search .............. 331/117 R, 331/117 FE, 167, 46, 48, 50, 55, 56, 45
See application file for complete search history.

(56) References Cited

U.S. PATENT DOCUMENTS

| 7,436,266 | B2 * | 10/2008 | Byun et al. | 331/117 R |
| 7,595,700 | B2 * | 9/2009 | Byun et al. | 331/117 R |
| 2008/0238559 | A1 * | 10/2008 | Kuwano | 331/109 |

OTHER PUBLICATIONS

Mirzaei, Ahmad, "The Quadrature LC Oscillator: A Complete Portrait Based on Injection Locking," *IEEE Journal of Solid-State Circuits*, 42:9, Sep. 2007.
Hamel, John S., "LC Tank Voltage Controlled Oscillator Tutorial," Presented to the UW ASIC Analog Group, edited by Ryan Norris, downloaded from http://www.actel.kr/_hdl/2/-asic.uwaterloo.ca/files/vcotut.pdf on Aug. 6, 2010, 2005.

* cited by examiner

*Primary Examiner* — Ryan Johnson
(74) *Attorney, Agent, or Firm* — Baker Botts L.L.P.

(57) ABSTRACT

In one embodiment, a method includes generating, by a LCVCO, a first signal having a first phase based on a resonant frequency of a first LC tank; generating, by a second LCVCO, a second periodic signal having a second phase based on a resonant frequency of a second LC tank; determining a phase offset between the first LC tank and the second LC tank based on the first and second signals; generating a first output signal and a second output signal based on the determined phase offset; and adjusting the phase offset such that the phase offset is substantially equal to a predetermined phase offset. In one embodiment, the adjusting comprises modulating a first impedance of the first LC tank based on the first output signal, and/or modulating a second impedance of the second LC tank based on the second output signal.

16 Claims, 6 Drawing Sheets

A clock and data recovery (CDR) circuit or system is one
FREQUENCY-COUPLED LCVCO

TECHNICAL FIELD

The present disclosure relates generally to generating multi-phase signals.

BACKGROUND

Multiple clock signals generated with different respective phases but with the same shared frequency are often collectively referred to as a multi-phase signal. One particular example of a multi-phase signal is a multi-phase clock (or multi-phase clock signal). Multi-phase clocks are used in many applications to improve, for example, the accuracy of timing while maintaining the same frequency. As an example, the nominal phase offset between each of the four constituent clock signals of a multi-phase quadrature clock is 90 degrees; that is, a first one of the clock signals of the multi-phase quadrature clock is nominally taken to have zero degree phase, the second one of the clock signals of the multi-phase quadrature clock has a nominal 90 degree phase offset relative to the first one of the clock signals, the third one of the clock signals of the multi-phase quadrature clock has a nominal 90 degree phase offset relative to the second one of the clock signals (and hence a 180 degree phase offset relative to the first one of the clock signals), and the fourth one of the clock signals of the multi-phase quadrature clock has a nominal 90 degree phase offset relative to the third one of the clock signals (and hence a 270 degree phase offset relative to the first one of the clock signals). As another example, the phase offset between the two clock signals of a multi-phase differential clock is nominally 180 degrees.

A clock and data recovery (CDR) circuit or system is one common example of a circuit or system that generally uses a multi-phase clock to avoid operating at the frequency of the incoming data. That is, by sampling the incoming data using a multi-phase clock, the frequency of the clock doesn't have to match the frequency of the incoming data (e.g., each constituent clock signal of an n-phase clock may have $1/n^{th}$ or less the frequency of the incoming data). CDR circuits are generally used to sample an incoming data signal, extract the clock from the incoming data signal, and retime the sampled data. A phase-locked loop (PLL)-based CDR circuit is a conventional type of CDR circuit. By way of example, in a conventional PLL-based CDR, a phase detector compares the phase between input data bits from a serial input data stream and a clock signal from a voltage-controlled oscillator (VCO). In response to the phase difference between the input data and the clock, the phase detector generates signals that will ultimately result in an increase (e.g., as a result of an "UP" signal) or decrease (e.g., as a result of a "DN" signal) of the frequency or phase of the clock signal generated by the VCO so as to match the frequency of the incoming data. A charge pump drives a current to or from a loop filter according to the UP and DN signals, respectively. The loop filter generates a control voltage $V_{CTRL}$ for the VCO based on the current driven to or from the loop filter based on the UP and DN signals. The loop just described serves as a feedback control system that tracks the phase of input data stream with the phase of the clock that the loop generates. The dynamics of the loop are generally determined by the open loop gain and the location of open loop zeroes and poles (predominantly in the loop filter).

In high-performance applications, a VCO is typically built around an LC tank that consists of an inductor and a capacitor arranged in a parallel configuration. This type of VCO is commonly referred to as an LCVCO. LCVCOs can be configured for fixed frequency and variable frequency operation, the latter being achieved with the use of a varactor (a variable capacitor). LCVCOs generally include two main stages: a gain stage and the LC tank. Furthermore, LCVCOs generally have excellent phase noise and jitter performance at high frequencies.

However, one problem with generating multiple clock phases with an LCVCO is that one LC tank can generate only two complementary clock phases (e.g., zero and 180 degrees), and hence, two LC tanks are typically coupled to one another to produce a desired phase shift in the clock signals generated by one of the two coupled LCVCOs (e.g., 90 degrees in the case of a quadrature clock). One example of an application in which a non-90 degree phase offset is desired or required is in a phase adjust specification in an optical communication system in which the data sampling phases are required to be user-controlled with respect to the center of the eye of the data.

DESCRIPTION OF EXAMPLE EMBODIMENTS

Particular embodiments relate to an electronic circuit, device, apparatus, system, or method for generating a multi-phase periodic signal, and more particularly, a multi-phase clock signal for use in various signal communication systems. As an example, particular embodiments relate to an electronic circuit, device, apparatus, system, or method for generating a multi-phase clock signal for use in a CDR circuit or system. In particular embodiments, the circuit, device, apparatus, system, or method is implemented by coupling two or more multi-phase generating LCVCOs. Particular embodiments may be configured to allow for a controllable or configurable phase offset between multi-phase generating LCVCOs. Furthermore, particular embodiments compensate for the mismatch-induced or coupling-induced phase errors in multi-phase generating LCVCOs. Particular embodiments may be utilized in high speed circuits or communication systems (e.g., having clock frequencies or data bit rates at or exceeding 2.5, 5, 10 or 20 Gigabits per second (Gb/s)).

In the following description, particular embodiments are described with reference to an implementation that generates a four-phase clock signal for use in a signal communication system. However, other embodiments may be applicable in generating other multi-phase signals including multi-phase clock signals having more than four constituent clock signals and respective phases, multi-phase clock signals whose constituent clock signals have respective phases that are offset relative to each other in increments of greater or less than 90 degrees (i.e., non-quadrature clock signals), and other periodic signals in general. Furthermore, as used herein, "or" may imply "and" as well as "or;" that is, "or" does not necessarily preclude "and," unless explicitly stated or implicitly implied.

Figure 1:
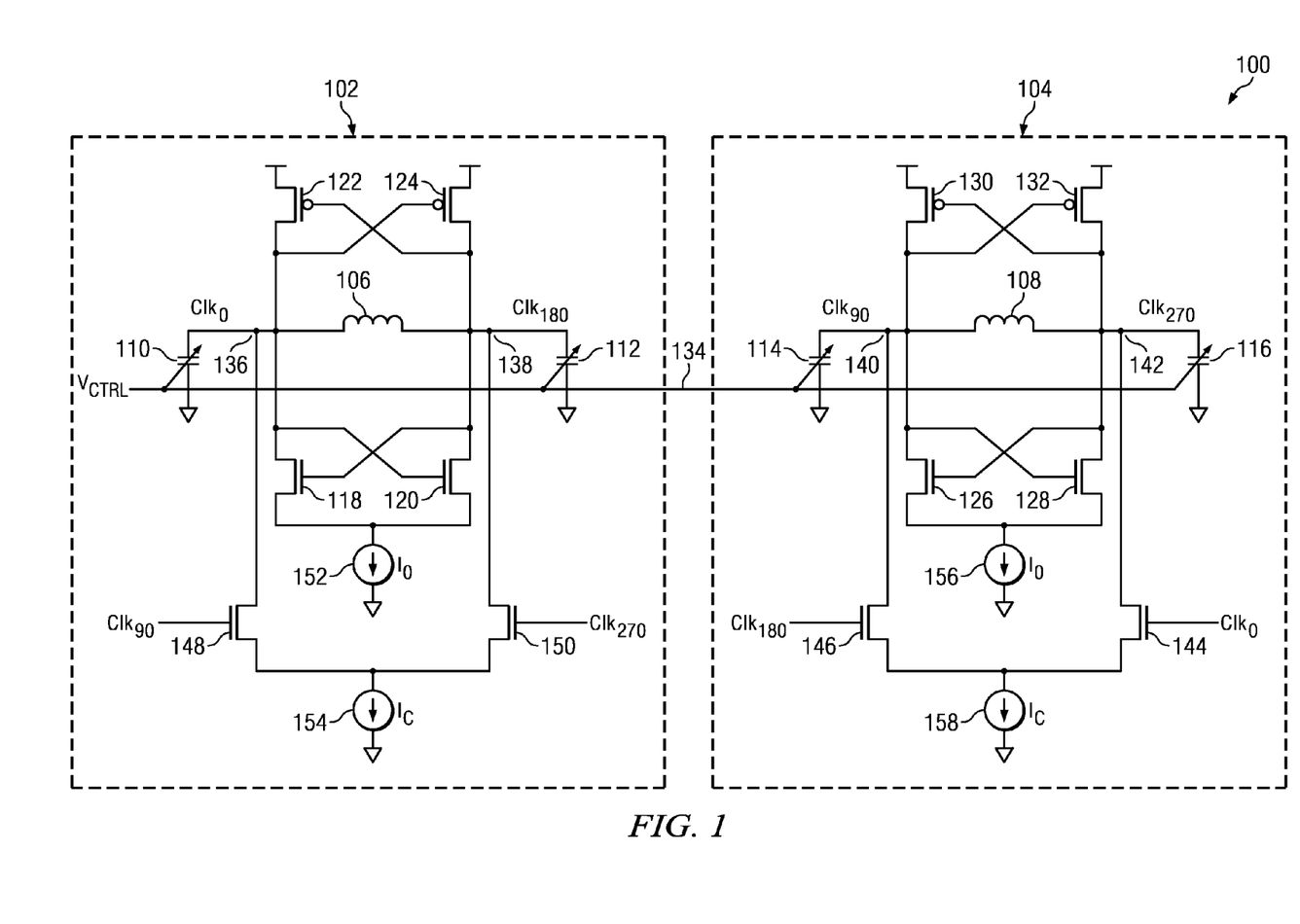
FIG. 1 illustrates an example circuit, apparatus, or system for generating a multi-phase quadrature clock that includes two coupled LCVCOs.

As described above, one problem with generating multiple clock phases with a single LCVCO is that one LC tank generates only two complementary clock phases (e.g., zero and 180 degrees), and hence, two LC tanks are typically coupled to one another to produce a desired phase shift (e.g., 90 degrees) so that, for example, a four-phase quadrature clock may be generated. FIG. 1 illustrates an example circuit or system 100 for generating a multi-phase quadrature clock based on a control voltage $V_{CTRL}$, which, in one example application, is received from a loop filter in a CDR circuit such as that described above. Circuit 100 includes a first LCVCO 102 and a second LCVCO 104. The first LCVCO 102 includes a first LC tank that includes inductor 106 and varactors 110 and 112 (a varactor is a variable capacitor, typically, a voltage-controlled capacitor). Similarly, the second LCVCO 104 includes a second LC tank that includes inductor 108 and varactors 114 and 116. LCVCO 102 further includes bias current sources 152 and 154 producing bias currents $I_O$ and $I_C$, respectively, while LCVCO 104 further includes bias current sources 156 and 158 producing bias currents $I_O$ and $I_C$, respectively. Each of the first and second LCVCOs 102 and 104 operate, nominally, at the same frequency but resonate at different phases. Each of the first and second LCVCOs 102 and 104 essentially includes a differential pair, or pair of differential pairs, that has/have been cross-coupled in a positive feedback configuration.

More particularly, the first LCVCO 102 includes a first differential pair that includes a first transistor 118 whose input (e.g., gate voltage) is electrically connected to the output (e.g., drain) of a second transistor 120 of the first differential pair. Additionally, the input (e.g., gate voltage) of the second transistor 120 is electrically connected to the output (e.g., drain) of the first transistor 118 of the first differential pair. The first LCVCO 102 also includes a second differential pair that includes a first transistor 122 whose input (e.g., gate voltage) is electrically connected to the output (e.g., source) of a second transistor 124 of the second differential pair, which is also electrically connected to the output of the second transistor 120 of the first differential pair such that these outputs share a common voltage which is then output to output node 138. Additionally, the input (e.g., gate voltage) of the second transistor 124 is electrically connected to the output (e.g., source) of the first transistor 122 of the second differential pair, which is also electrically connected to the output of the first transistor 118 of the first differential pair such that these outputs share a common voltage which is output to output node 136. The inductor 106 is connected between output nodes 136 and 138.

Similarly, the second LCVCO 104 includes a first differential pair that includes a first transistor 126 whose input is electrically connected to the output of a second transistor 128 of the first differential pair. Additionally, the input of the second transistor 128 is electrically connected to the output of the first transistor 126 of the first differential pair. The second LCVCO 104 also includes a second differential pair that includes a first transistor 130 whose input is electrically connected to the output of a second transistor 132 of the second differential pair, which is also electrically connected to the output of the second transistor 128 of the first differential pair such that these outputs share a common voltage which is then output to output node 142. Additionally, the input of the second transistor 132 is electrically connected to the output of the first transistor 130 of the second differential pair, which is also electrically connected to the output of the first transistor 126 of the first differential pair such that these outputs share a common voltage which is output to output node 140. The inductor 108 is connected between output nodes 140 and 142. In the illustrated implementation, each of the transistors 118, 120, 126, and 128, as well as transistors 144, 146, 148, and 150 described below, is a metal-oxide-semiconductor field-effect transistor (MOSFET), and more particularly, an n-channel MOSFET (nMOSFET), while each of transistors 122, 124, 130, and 132 is a p-channel MOSFET (pMOSFET).

Circuit 100 oscillates in quadrature, nominally, due to the symmetry of the constituent LCVCOs 102 and 104, and thus, any mismatches in the components of the two LCVCOs 102 and 104 may skew the desired phase offset (90 degrees) between the two LC tanks in the respective LCVCOs 102 and 104. In particular, LCVCO 102 oscillates at a frequency $\omega_{osc}$ and outputs a first clock signal $Clk_0$ on output node 136 at a clock frequency $f_{clk}$ (where $\omega_{osc}=2\pi*f_{clk}$) having a nominal phase of zero degrees and a second clock signal $Clk_{180}$ on output node 138 at the clock frequency $f_{clk}$ having a nominal phase of 180 degrees relative to $Clk_0$. Similarly, LCVCO 104 oscillates nominally at the frequency $\omega_{osc}$ and outputs a third clock signal $Clk_{90}$ on output node 140 at the clock frequency $f_{clk}$ having a nominal phase of 90 degrees relative to $Clk_0$ and a fourth clock signal $Clk_{270}$ on output node 142 at the clock frequency $f_{clk}$ having a nominal phase of 270 degrees relative to $Clk_0$. Collectively, the clock signals $Clk_0$, $Clk_{90}$, $Clk_{180}$, and $Clk_{270}$ constitute a four-phase quadrature clock under ideal operation, conditions, and construction. As FIG. 1 illustrates, clock signals $Clk_0$ and $Clk_{180}$ output from LCVCO 102 are routed to the inputs (e.g., gates) of transistors 144 and 146, respectively, of LCVCO 104. Similarly, clock signals $Clk_{90}$ and $Clk_{270}$ output from LCVCO 104 are routed to the inputs (e.g., gates) of transistors 148 and 150, respectively, of LCVCO 102. Additionally, the first and second LCVCOs 102 and 104 are further coupled by common node or trace 134.

Figure 2A:
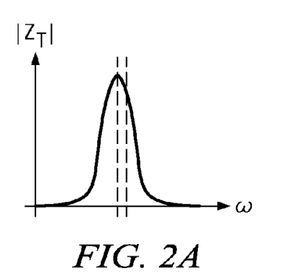
FIG. 2A illustrates the magnitude of the impedance of an example LC tank of one of the LCVCOs of FIG. 1 as a function of the clock frequency at which the impedance is measured.
Figure 2B:
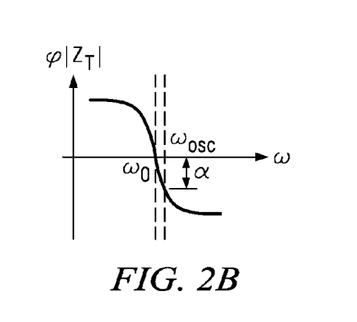
FIG. 2B illustrates the corresponding phase angle of the impedance of the example LC tank of one of the LCVCOs of FIG. 1 as a function of the clock frequency at which the impedance is measured.

FIG. 2A illustrates a plot of the magnitude of the impedance $Z_T$ of each LC tank in each of LCVCOs 102 and 104 versus the frequency of oscillation $\omega$ of each LC tank. FIG. 2B illustrates a plot of the phase angle $\phi$ of the impedance of each LC tank in each of LCVCOs 102 and 104 versus the frequency of oscillation $\omega$ of each LC tank, where $\omega_{osc}$ represents the actual frequency of oscillation of each LC tank. As shown in FIGS. 2A and 2B, the coupling between the first and second LCVCOs 102 and 104 causes a "strain" in the respective LC tanks in that each of the LC tanks in each of LCVCOs 102 and 104 oscillate at a frequency $\omega_{osc}$ that is different than the resonant frequency $\omega_0$ of each LC tank. As a result, the effective quality factor Q of each of the LC tanks in each of LCVCOs 102 and 104 decreases.

Figure 2C:
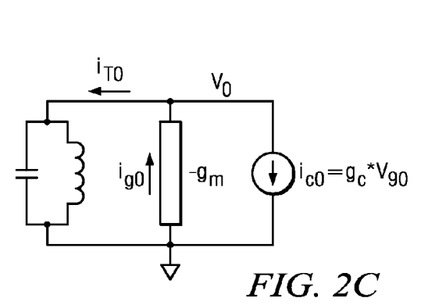
FIG. 2C illustrates an example equivalent circuit representation of one of the LCVCOs of FIG. 1.
Figure 2D:
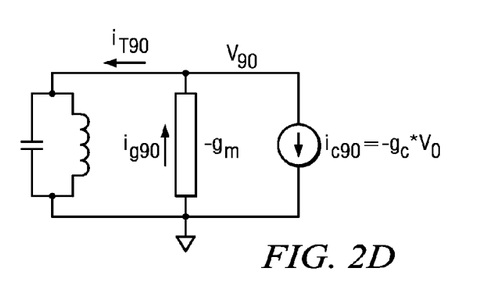
FIG. 2D illustrates an example equivalent circuit representation of the other one of the LCVCOs of FIG. 1.
Figure 2E:
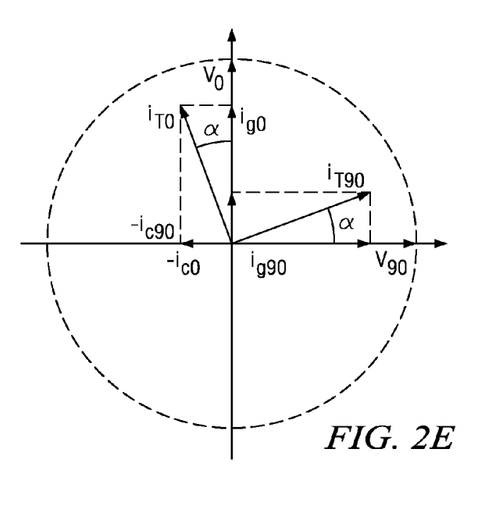
FIG. 2E illustrates an example of the phase and magnitude relationships between the currents and voltages in the LC tanks of the two coupled LCVCOs of FIG. 1.

FIGS. 2C and 2D illustrate equivalent circuit representations characterizing the behavior of LCVCOs 102 and 104, respectively, while FIG. 2E illustrates a phasor diagram of the voltages and currents of circuit 100. More particularly, FIG. 2E illustrates an example of the phase and magnitude relationships between the currents and voltages in the LC tanks of the two coupled LCVCOs of FIG. 1 showing that the currents do not have the same phases as the voltages, which indicates that the LC tanks do not operate at $\omega_0$, but at $\omega_{osc}$. In FIGS. 2C, 2D, and 2E, $i_{T0}$ is the current of the LC tank of LCVCO 102 resulting from the inductance from inductor 106 and all capacitance at nodes 136 and 138, including the varactors 110 and 112, $i_{T90}$ is the current of the LC tank of LCVCO 104 resulting from the inductance of inductor 108 and all capacitance at nodes 140 and 142, including the varactors 114 and 116, $V_0$ is the differential voltage between nodes 136 and 138 ($Clk_0$ and $Clk_{180}$) of LCVCO 102, $V_{90}$ is the differential voltage between nodes 140 and 142 ($Clk_{90}$ and $Clk_{270}$) of LCVCO 104, $i_{g0}$ is the current difference between the currents of transistors 118 and 120 of LCVCO 102, $i_{g90}$ is the current difference between the currents of transistors 126 and 128 of LCVCO 104, $g_m$ is the transconductance (which depends on $I_0$ and $I_C$) of the first differential pairs of LCVCOs 102 and 104 (where again the first differential pair of LCVCO 102 is formed by the coupled transistors 118 and 120 and the first differential pair of LCVCO 104 is formed by the coupled transistors 126 and 128), $i_{c0}$ is the current difference between the currents of the transistors 148 and 150 of LCVCO 102, $i_{c90}$ is the current difference between the currents of the transistors 146 and 144 of LCVCO 104, and $g_c$ is the transconductance (which depends on $I_0$ and $I_C$) of third differential pairs of LCVCOs 102 and 104 (where the third differential pair of LCVCO 102 is formed by the coupled transistors 148 and 150 and the third differential pair of LCVCO 104 is formed by the coupled transistors 144 and 146).

The noise properties of the coupled first and second LCVCOs 102 and 104 are worse than those of a comparable single uncoupled LCVCO. Furthermore, circuit 100 has higher sensitivity to ground and power supply noise due to the dependence of the oscillating frequency $\omega$ on the magnitude of the bias currents $I_0$ and $I_C$. Moreover, any component or bias current mismatch, or substrate or magnetic coupling between inductors 106 and 108, may result in phase error or skew between the LC tanks, and hence, the clock signals $Clk_0$, $Clk_{90}$, $Clk_{180}$, and $Clk_{270}$ they output. Another disadvantage of circuit 100 is that the circuit topology doesn't allow for a controllable phase offset between the clock signals $Clk_0$, $Clk_{90}$, $Clk_{180}$, and $Clk_{270}$; that is, the phases of the clock signals $Clk_0$, $Clk_{90}$, $Clk_{180}$, and $Clk_{270}$ are offset by fixed amounts, and in this particular example, in incremental offsets of nominally 90 degrees.

Figure 3:
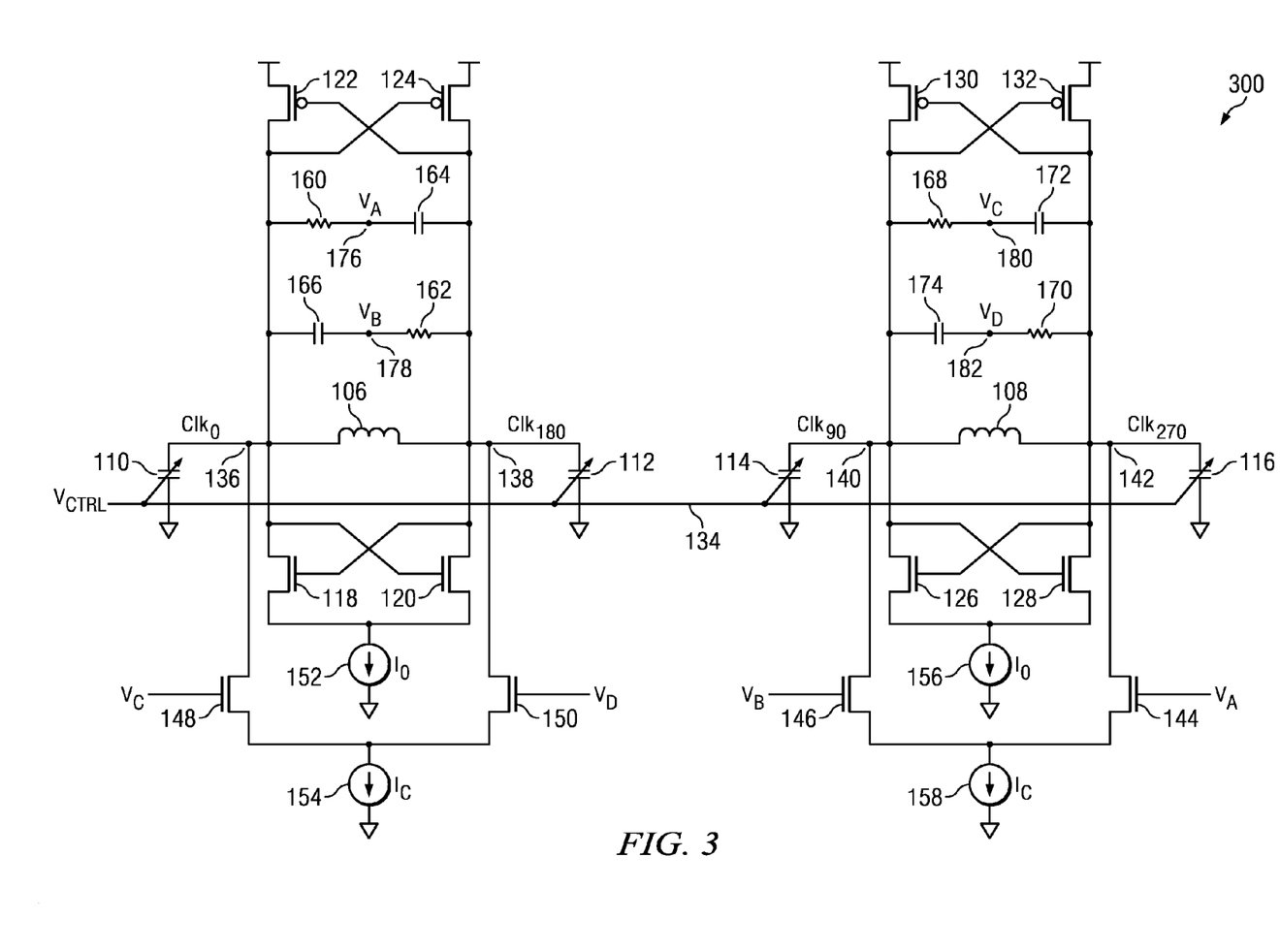
FIG. 3 illustrates an example circuit for generating a multi-phase quadrature clock that includes two coupled LCVCOs that each include a passive RC filter.

Conventional solutions or improvements to circuit 100 and those like it involve inserting passive circuits, typically an all-pass RC filter, prior to coupling, an example of which FIG. 3 illustrates. More particularly, FIG. 3 illustrates a circuit 300 in which all-pass RC filters are coupled between the output nodes of each of LCVCOs 102 and 104; that is between output nodes 136 and 138 of LCVCO 102 and between output nodes 140 and 142 of LCVCO 104. More specifically, in FIG. 3, LCVCO 102 includes an RC filter implemented with resistors 160 and 162 and capacitors 164 and 166 connected as FIG. 3 illustrates. Similarly, LCVCO 104 includes an RC filter implemented with resistors 168 and 170 and capacitors 172 and 174 connected as FIG. 3 illustrates. The resultant voltage signals $V_A$, $V_B$, $V_C$, and $V_D$, produced on nodes 176, 178, 180, and 182, respectively, are then routed to the inputs (e.g., gates) of transistors 144, 146, 148, and 150, respectively, further coupling the two LCVCOs 102 and 104. With proper values of the components (e.g., the resistance and capacitance values of the resistors and capacitors 160, 162, 164, 166, 168, 170, 172, 174) of the all-pass filters in LCVCOs 102 and 104, the respective phase-shifted coupling voltage signals $V_A/V_B$ and $V_C/V_D$ are in phase with the respective LC tank voltage signals $Clk_{90}/Clk_{270}$ (generated by LCVCO 104) and $Clk_0/Clk_{180}$ (generated by LCVCO 102) However, as with circuit 100 of FIG. 1, circuit 300 does not include any means of exerting a controllable phase shift between the LC tanks of the two LCVCOs 102 and 104 other than 90 degrees. Furthermore, circuit 300 does not include any means for correcting for a phase error caused by an undesired tank coupling between LCVCOs 102 and 104 or component mismatch.

Figure 4:
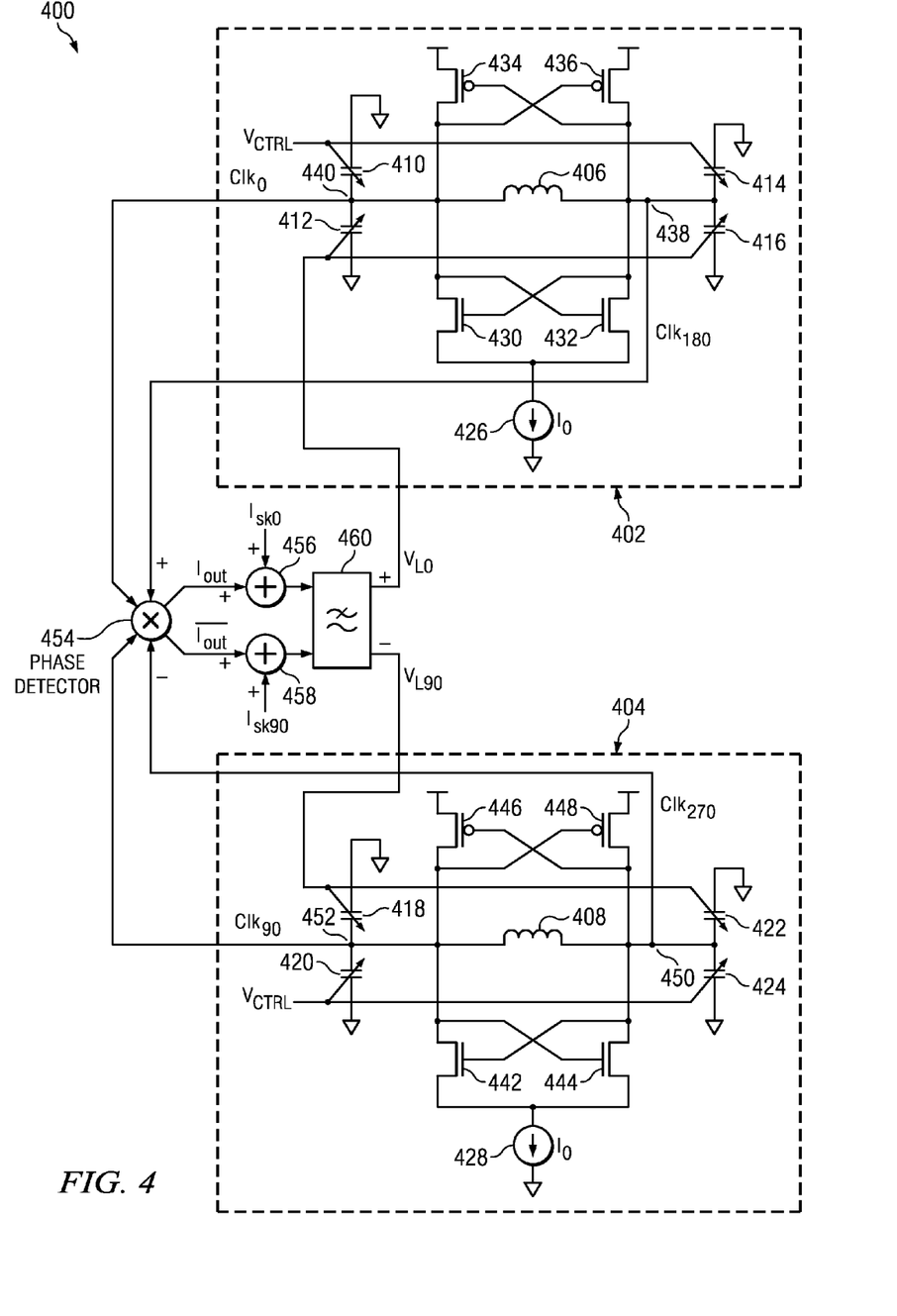
FIG. 4 illustrates an example circuit for generating a multi-phase clock that includes two LCVCOs and a phase detector.

FIG. 4 illustrates an example circuit 400 in accordance with particular embodiments for generating a multi-phase periodic signal, and more particularly, a multi-phase clock signal. In particular embodiments, circuit 400 may be configured to allow for a controllable or configurable phase offset between multi-phase generating LCVCOs. Furthermore, particular embodiments compensate for the mismatch-induced or coupling-induced phase errors in multi-phase generating LCVCOs. In particular embodiments, circuit 400 includes a first LCVCO 402 and a second LCVCO 404. In particular embodiments, the first LCVCO 402 includes a first LC tank that includes inductor 406 and varactors 410, 412, 414, and 416. Similarly, the second LCVCO 404 includes a second LC tank that includes inductor 408 and varactors 418, 420, 422, and 424. LCVCO 402 further includes current source 426 producing bias current $I_0$ while LCVCO 404 further includes current source 428 producing bias current $I_0$. In particular embodiments, each of the first and second LCVCOs 402 and 404 operate, nominally, at the same frequency but resonate at different phases. Each of the first and second LCVCOs 402 and 404 includes an NMOS differential pair and a PMOS pair, each of which has been cross-coupled in a positive feedback configuration to provide a negative resistance needed to compensate for tank losses. In one embodiment, the PMOS pair may be a differential pair, but in the embodiment illustrated in FIG. 4, it is not a differential pair but implemented as a set of cross-coupled transistors.

In one example embodiment, the first LCVCO 402 includes a first NMOS differential pair that includes a first transistor 430 whose input (e.g., gate voltage) is electrically connected to the output (e.g., drain) of a second transistor 432 of the first differential pair. Additionally, the input (e.g., gate voltage) of the second transistor 432 is electrically connected to the output (e.g., drain) of the first transistor 430 of the first differential pair. The first LCVCO 402 may also include a second PMOS cross-coupled pair that includes a first transistor 434 whose input (e.g., gate voltage) is electrically connected to the output (e.g., source) of a second transistor 436 of the second cross-coupled pair, which is also electrically connected to the output of the second transistor 432 of the first differential pair such that these outputs share a common voltage which is then output to output node 438. Additionally, the input (e.g., gate voltage) of the second transistor 436 is electrically connected to the output (e.g., source) of the first transistor 434 of the second pair, which is also electrically connected to the output of the first transistor 430 of the first differential pair such that these outputs share a common voltage which is output to output node 440. The inductor 406 is connected between output nodes 438 and 440.

Similarly, the second LCVCO 404 may include a first NMOS differential pair that includes a first transistor 442 whose input is electrically connected to the output of a second transistor 444 of the first differential pair. Additionally, the input of the second transistor 444 is electrically connected to the output of the first transistor 442 of the first differential pair. The second LCVCO 404 may also include a second PMOS pair that includes a first transistor 446 whose input is electrically connected to the output of a second transistor 448 of the second pair, which is also electrically connected to the output of the second transistor 444 of the first differential pair such that these outputs share a common voltage which is then output to output node 450. Additionally, the input of the second transistor 448 is electrically connected to the output of the first transistor 446 of the second pair, which is also electrically connected to the output of the first transistor 442 of the first differential pair such that these outputs share a common voltage which is output to output node 452. The inductor 408 is connected between output nodes 450 and 452. In illustrated embodiment, each of the transistors 430, 432, 442, and 444, is an nMOSFET, while each of transistors 434, 436, 446, and 448 is a pMOSFET.

In particular embodiments, the LC tanks in the LCVCOs 402 and 404 are coupled by modulating the frequency of oscillation of each of the LC tanks to achieve a desired phase offset between the phases of the clock signals output from the two LCVCOs 402 and 404. In the illustrated embodiment, the phase offset between the phases of the first and second clock signals output from LCVCO 404 is 90 degrees relative to the phases of the first and second clock signals output from LCVCO 402, respectively; that is, in this example, circuit 400 oscillates in quadrature producing clock signals $Clk_0$, $Clk_{90}$, $Clk_{180}$, and $Clk_{270}$ at output nodes 440, 452, 438, and 450, respectively, and having phases of zero, 90, 180, and 270 degrees, respectively. In particular embodiments, the clock signals $Clk_0$, $Clk_{90}$, $Clk_{180}$, and $Clk_{270}$ are input to a phase detector 454, which detects or determines the phase offset between the LC tank in LCVCO 402 and the LC tank in LCVCO 404. In one example embodiment, phase detector 454 comprises a multiplying mixer cell, and more particularly, a Gilbert cell, an example of which is illustrated by way of FIGS. 5A-5C.

Figure 5A:
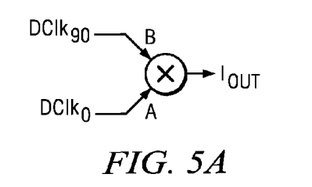
FIG. 5A illustrates an example equivalent symbol representation of an example Gilbert cell that may be used as a phase detector.
Figure 5B:
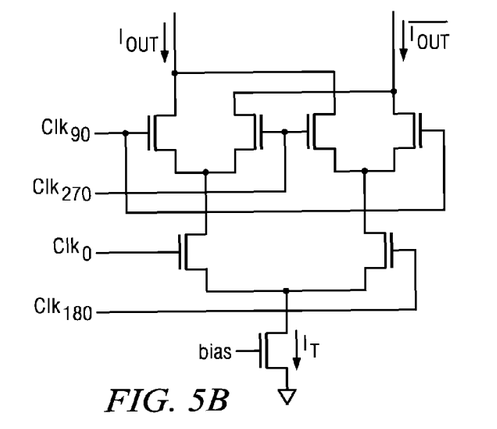
FIG. 5B illustrates an example Gilbert cell.
Figure 5C:
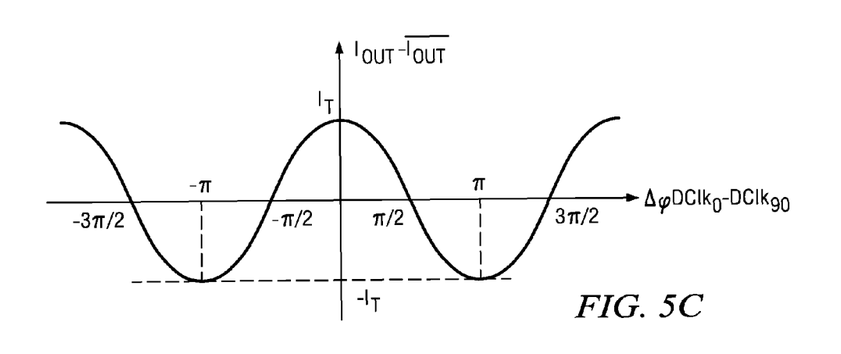
FIG. 5C illustrates example differential signal output from the Gilbert cell of FIG. 5A as a function of phase offset between the differential signals input to the Gilbert cell of FIG. 5A.

A Gilbert cell is an electronic multiplying mixer. By way of reference, the output current $I_{out}$ of a Gilbert cell is an accurate multiplication of the (differential) base currents of both inputs. In the example embodiment, $Clk_0$ and $Clk_{180}$ collectively represent a first differential signal, referred to in FIG. 5A as $DClk_0$, while $Clk_{90}$ and $Clk_{270}$ collectively represent a second differential signal, referred to in FIG. 5A as $DClk_{90}$. In this example, the second differential signal $DClk_{90}$ has a desired phase offset of 90 degrees relative to the phase of the first differential signal $DClk_0$ (although in other embodiments the desired phase offset may be less than or greater than 90 degrees as desired). FIG. 5A illustrates an accepted equivalent symbol for the Gilbert cell used to implement phase detector 454, while FIG. 5B illustrates a circuit schematic of an example Gilbert cell suitable for use as the Gilbert cell of FIG. 5A and having inputs for receiving the two differential signals $DClk_0$ (representing signals $Clk_0$ and $Clk_{180}$) and $DClk_{90}$ (representing signals $Clk_{90}$ and $Clk_{270}$). FIG. 5C illustrates the value of the output differential signal $I_{out} - \overline{I_{out}}$ as a function of the phase offset $\Delta\phi(DClk_0 - DClk_{90})$ between the differential input signals $DClk_0$ and $DClk_{90}$.

Thus, in this example embodiment, phase detector 454 outputs zero current ($I_{out}=0$) when the difference in phase between the differential input signals $DClk_0$ and $DClk_{90}$ (and more generally the respective LC tanks) is 90 degrees. The outputs of phase detector 454, the signals $I_{out}$ and $\overline{I_{out}}$, are then input to adders (or simple net summing circuits) 456 and 458, respectively. The adders 456 and 458 add the baseband currents $I_{SK0}$ and $I_{SK90}$ to the output signals $I_{out}$ and $\overline{I_{out}}$ respectively. The sums output by the adders 456 and 458 are then low-pass filtered by low pass filter (LPF) 460, which generates the baseband voltages $V_{L0}$ and $V_{L90}$. The voltage $V_{L0}$ is used to modulate the capacitances of the varactors 412 and 416 that contribute, along with varactors 410 and 414 (which are modulated by $V_{CTRL}$) to the total capacitance of the LC tank of first LCVCO 402. Similarly, the voltage $V_{L90}$ is used to modulate the capacitances of varactors 418 and 422 that contribute, along with varactors 420 and 424 (which are also modulated by $V_{CTRL}$) to the total capacitance of the LC tank of second LCVCO 404.

In particular embodiments, in order to avoid a significant reduction of the tuning range of the LCVCOs 402 and 404, the coupling varactors may constitute only a small part (e.g., 5-10%) of the total capacitance of each of the LC tanks in LCVCOs 402 and 404, as long as it is sufficient to compensate for the LC tank impedance mismatch. In the illustrated embodiment, it is assumed that an increase in the control voltage applied to each of the varactors reduces its capacitance and therefore increases the actual frequency of oscillation $\omega_{osc}$ of the corresponding LC tank (also true with NMOS varactors in n-well, where the control voltage connects to the well).

The local loops (i.e., those of the two respective LCVCOs 402 and 404) reach equilibrium when the current difference $I_{OUT} - \overline{I_{OUT}} = I_{SK90} - I_{SK0}$. This condition is met when the input phase difference between the LC tanks in LCVCOs 402 and 404 is $\Delta\phi = \pi/2 + (I_{SK0} - I_{SK90})/K_{PD}$ where $K_{PD}$ is the gain of phase detector 454.

In equilibrium, the phases of the two LC tanks of LCVCOs 402 and 404 are skewed by an arbitrary amount controlled by the signals $I_{SK0}$ and $I_{SK90}$. If $I_{SK0} - I_{SK90} = 0$, exact quadrature phase shift is established between the LC tanks (e.g., the phase offset between the two LC tanks is 90 degrees). However, by applying $I_{SK0} - I_{SK90} > 0$, a positive skew is introduced (e.g., the phase offset between the two LC tanks is greater than 90 degrees). Similarly, by applying $I_{SK0} - I_{SK90} < 0$, a negative skew is introduced (e.g., the phase offset between the two LC tanks is less than 90 degrees). Furthermore, as the gain of the phase detector 454 has the opposite sign in case of the opposite phase ordering, this opposite phase ordering may result in an unstable state and circuit 400 may eventually reach the correct (desired) phase order without external assistance.

In particular embodiments, to ensure that circuit 400 operates properly or as desired, the local loop consisting of the PD 454, summers 456 and 458, LPF 460, and the LCVCOs 402 and 404 must have higher bandwidth than the bandwidth of the global CDR (PLL) loop, if that is the application of circuit 400, to ensure that both of the LC tanks in LCVCOs 402 and 404 track the input phase in a controlled manner. Second, to prevent frequency "beating" (e.g., a case in which two LC tanks operate at similar frequencies so that the output of the phase detector is at too high a frequency to be filtered out by the local loop), the local loop bandwidth must be larger than the maximum difference between the LC tank resonant frequencies, including each of the LC tanks inductance and capacitance mismatches. Third, the bandwidth of the local loops must not be much greater than (and preferably less than) its open loop dominant pole to ensure the stability of the local loop.

In particular embodiments, the frequency coupling system can be used to at least partially compensate for mismatches between the LC tanks in each of the LCVCOs 402 and 404. In case the LC tank in LCVCO 402 doesn't match the LC tank in LCVCO 404, and assuming that $I_{SK0}-I_{SK90}=0$, the local loops set the voltages $V_{L0}$ and $V_{L90}$ to different values so that the frequency offset between the LC tank in LCVCO 402 and the LC tank in LCVCO 404 is zero, and furthermore, such that the phase offset between the LC tank in LCVCO 402 and the LC tank in LCVCO 404 is $\Delta\phi=\pi/2\pm\Delta\omega/K_{LOOP}$, where $\Delta\omega$ is the frequency mismatch between the LC tank in LCVCO 402 and the LC tank in LCVCO 404, and $K_{LOOP}$ is the local loop gain. In other words, the local loop varactors are set to the values that compensate for the LC tank frequency mismatches; the phase deviation from the ideal $\pi/2$ (90 degrees) in this case is determined by the loop gain $K_{LOOP}$, which is usually a first approximation for the loop bandwidth. Therefore, the loop still forces the phase offset to almost $\pi/2$ provided that the frequency mismatch is much smaller than the local loop bandwidth. By equalizing the resonant frequencies of the LC tank in LCVCO 402 and the LC tank in LCVCO 404, the described frequency-coupled topology of circuit 400 allows the LCVCOs 402 and 404 to operate at the maximum of its quality factor Q and, thus, minimizes phase noise.

In particular embodiments, to completely eliminate both frequency mismatch and phase error in the steady-state, the loop needs to incorporate another 1/s term in the loop filter in its transfer function. However, such an addition may also require adding a zero in the loop in order to preserve stability and achieve a sufficient phase margin.

Thus, particular embodiments, including particular embodiments of circuit 400, allow for a controllable phase delay of multi-phase generating LCVCOs. Furthermore, particular embodiments compensate for the mismatch-induced or coupling-induced phase errors in the multi-phase generating LCVCOs.

Figure 6:
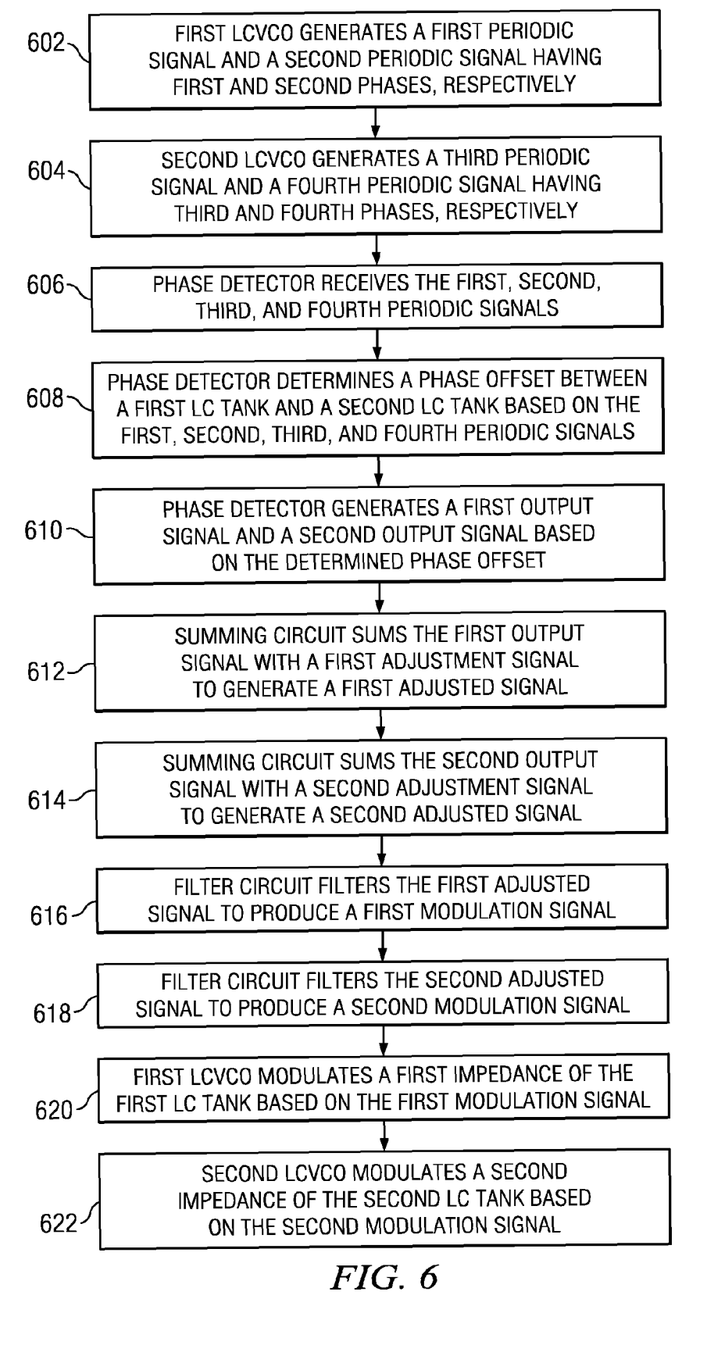
FIG. 6 illustrates an example method for generating a multi-phase clock.

FIG. 6 illustrates a flowchart illustrating an example method for generating a multi-phase clock signal. In particular embodiments, at 602 a first LCVCO that includes a first LC tank generates a first periodic signal having a frequency and a first phase and a second periodic signal having the frequency and a second phase, the second phase being offset from the first phase by a first phase offset. At 604, which, in particular embodiments is in parallel with 602, a second LCVCO that includes a second LC tank generates a third periodic signal having the frequency and a third phase and a fourth periodic signal having the frequency and a fourth phase, the fourth phase being offset from the third phase by a second phase offset. At 606 a phase detector receives the first, second, third, and fourth periodic signals, and at 608, determines a third phase offset between the first LC tank and the second LC tank based on the first, second, third, and fourth periodic signals. At 610, the phase detector generates a first output signal and a second output signal based on the determined third phase offset. At 612, a summing circuit sums the first output signal with a first adjustment signal to generate a first adjusted signal and, at 614, which, in particular embodiments, is in parallel with 612, sums the second output signal with a second adjustment signal to generate a second adjusted signal. In one embodiment, a filter circuit filters the first adjusted signal to produce a first modulation signal and filters the second adjusted signal to produce a second modulation signal at 616 and 618, respectively, which, in particular embodiments, are performed in parallel. At 620, the first LCVCO modulates a first impedance of the first LC tank based on the first modulation signal to adjust a resonant frequency of the first LC tank. At 622, which, in particular embodiments, is in parallel with 620, the second LCVCO modulates a second impedance of the second LC tank based on the second modulation signal to adjust a resonant frequency of the second LC tank. In particular embodiments, after one or more iterations, the modulating of the first LC tank and the modulating of the second LC tank adjusts the third phase offset such that the third phase offset is equal to a predetermined phase offset such that first and second phases are offset by the predetermined phase offset relative to the third and fourth phases, respectively.

Although the present disclosure describes and illustrates particular steps of the method or process of FIG. 6 as occurring in a particular order, the present disclosure contemplates any suitable steps of the method of FIG. 6 occurring in any suitable order as well as iteratively or on a continuous basis. Moreover, although the present disclosure describes and illustrates particular components carrying out particular steps of the method of FIG. 6, the present disclosure contemplates any suitable combination of any suitable components carrying out any suitable steps of the method of FIG. 6.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

The invention claimed is:

1. A method comprising:
generating, by a first inductor-capacitor based voltage-controlled oscillator (LCVCO) that includes a first LC tank, a first periodic signal having a frequency and a first phase based on a resonant frequency of the first LC tank;
generating, by a second LCVCO that includes a second LC tank, a second periodic signal having the frequency and a second phase based on a resonant frequency of the second LC tank;
determining, by a phase detector, a phase offset between the first LC tank and the second LC tank based on the first and second periodic signals;
generating, by the phase detector, a first output signal and a second output signal based on the determined phase offset;
adjusting the phase offset such that the phase offset is substantially equal to a predetermined phase offset, the adjusting comprising:
modulating, by the first LCVCO, a first impedance of the first LC tank based on the first output signal to adjust the resonant frequency of the first LC tank; and/or
modulating, by the second LCVCO, a second impedance of the second LC tank based on the second output signal to adjust the resonant frequency of the second LC tank; and
summing the first output signal with a first adjustment signal to generate a first adjusted signal and summing the second output signal with a second adjustment signal to generate a second adjusted signal;
wherein:
modulating, by the first LCVCO, the first impedance of the first LC tank based on the first output signal comprises modulating, by the first LCVCO, the first impedance of the first LC tank based on the first adjusted signal; and
modulating, by the second LCVCO, the second impedance of the second LC tank based on the second output signal comprises modulating, by second LCVCO, the second impedance of the second LC tank based on the second adjusted signal.

2. The method of claim 1, further comprising filtering, by a filter circuit, the first adjusted signal to produce a first modulation signal and filtering the second adjusted signal to produce a second modulation signal; and
wherein:
modulating, by the first LCVCO, the first impedance of the first LC tank based on the first adjusted signal comprises modulating, by the first LCVCO, the first impedance of the first LC tank based on the first modulation signal; and
modulating, by the second LCVCO, the second impedance of the second LC tank based on the second adjusted signal comprises modulating, by second LCVCO, the second impedance of the second LC tank based on the second modulation signal.

3. The method of claim 1, wherein the first and second LCVCOs reach equilibrium when the difference between the magnitude of the first output signal and the magnitude of the second output signal equals the difference between the magnitude of the first adjustment signal and the magnitude of the second adjustment signal.

4. The method of claim 1, wherein the predetermined phase offset is adjustable.

5. The method of claim 4, wherein:
when the difference between the magnitudes of the first and second adjustment signals is zero, the predetermined phase offset is 90 degrees;
when the difference between the magnitudes of the first and second adjustment signals is greater than zero, the predetermined phase offset is greater than 90 degrees; and
when the difference between the magnitudes of the first and second adjustment signals is less than zero, the predetermined phase offset is less than 90 degrees.

6. A circuit comprising:
a first inductor-capacitor based voltage-controlled oscillator (LCVCO) that includes a first LC tank, the first LCVCO being configured to generate a first periodic signal having a frequency and a first phase based on a resonant frequency of the first LC tank;
a second LCVCO that includes a second LC tank, the second LCVCO being configured to generate a second periodic signal having the frequency and a second phase based on a resonant frequency of the second LC tank; and
a phase detector configured to:
determine a phase offset between the first LC tank and the second LC tank based on the first and second periodic signals; and
generate a first output signal and a second output signal based on the determined phase offset;
wherein one or both of the first and second LCVCOs are configured to adjust the phase offset such that the phase offset is substantially equal to a predetermined phase offset, wherein to adjust the phase offset:
the first LCVCO is configured to modulate a first impedance of the first LC tank based on the first output signal to adjust the resonant frequency of the first LC tank; and
the second LCVCO is configured to modulate a second impedance of the second LC tank based on the second output signal to adjust the resonant frequency of the second LC tank.

7. The circuit of claim 6, wherein:
the first periodic signal is a differential signal comprising a first differential periodic signal and a second differential periodic signal, the first differential periodic signal and the second differential periodic signal having respective phases that are offset by 180 degrees; and
the second periodic signal is a differential signal comprising a third differential periodic signal and a fourth differential periodic signal, the third differential periodic signal and the fourth differential periodic signal having respective phases that are offset by 180 degrees.

8. The circuit of claim 7, wherein each of the first differential periodic signal, second differential periodic signal, third differential periodic signal, and fourth differential periodic signal is a clock signal.

9. The circuit of claim 6, further comprising a summing circuit configured to sum the first output signal with a first adjustment signal to generate a first adjusted signal and to sum the second output signal with a second adjustment signal to generate a second adjusted signal;
wherein:
to modulate the first impedance of the first LC tank based on the first output signal, the first LCVCO is configured to modulate the first impedance of the first LC tank based on the first adjusted signal; and
to modulate the second impedance of the second LC tank based on the second output signal, the second LCVCO is configured to modulate the second impedance of the second LC tank based on the second adjusted signal.

10. The circuit of claim 9, further comprising a filter circuit configured to filter the first adjusted signal to produce a first modulation signal and to filter the second adjusted signal to produce a second modulation signal; and
wherein:
to modulate the first impedance of the first LC tank based on the first adjusted signal, the first LCVCO is configured to modulate the first impedance of the first LC tank based on the first modulation signal; and
to modulate the second impedance of the second LC tank based on the second adjusted signal, the second LCVCO is configured to modulate the second impedance of the second LC tank based on the second modulation signal.

11. The circuit of claim 9, wherein the first and second LCVCOs reach equilibrium when the difference between the magnitude of the first output signal and the magnitude of the second output signal equals the difference between the magnitude of the first adjustment signal and the magnitude of the second adjustment signal.

12. The circuit of claim 9, wherein the predetermined phase offset is adjustable.

13. The circuit of claim 12, wherein:
when the difference between the magnitudes of the first and second adjustment signals is zero, the predetermined phase offset is 90 degrees;

when the difference between the magnitudes of the first and second adjustment signals is greater than zero, the predetermined phase offset is greater than 90 degrees; and when the difference between the magnitudes of the first and second adjustment signals is less than zero, the predetermined phase offset is less than 90 degrees.

14. The circuit of claim 6, wherein the first output signal and the second output signal together constitute a differential output signal.

15. The circuit of claim 14, wherein a current of the differential output signal has a value of zero when the phase offset is equal to the predetermined phase offset.

16. The circuit of claim 6, wherein the phase detector comprises a Gilbert cell that receives as input the first and second periodic signals and outputs the first and second output signals.

* * * * *